United States Patent [19]

Alameddine et al.

[11] 4,239,810
[45] Dec. 16, 1980

[54] METHOD OF MAKING SILICON PHOTOVOLTAIC CELLS

[75] Inventors: Oussama Alameddine, Schoenaich; Marian Briska; Klaus P. Thiel, both of Boeblingen, all of Fed. Rep. of Germany

[73] Assignee: International Business Machines Corporation, Armonk, N.Y.

[21] Appl. No.: 959,540

[22] Filed: Nov. 13, 1978

[30] Foreign Application Priority Data

Dec. 8, 1977 [DE] Fed. Rep. of Germany ....... 2754652

[51] Int. Cl.³ ............................................ H01L 31/18
[52] U.S. Cl. ..................................... 427/75; 148/185; 204/192 P; 427/74
[58] Field of Search .................... 148/185; 427/74, 75; 204/192 SP, 192 P; 136/89 CC, 89 SG; 29/572

[56] References Cited

U.S. PATENT DOCUMENTS

| | | | |
|---|---|---|---|
| 3,413,157 | 11/1968 | Kuiper | 148/1.5 |
| 3,755,015 | 8/1973 | Redington | 29/572 |
| 3,772,768 | 11/1973 | Fisher | 29/572 |
| 3,895,975 | 7/1975 | Lindmayer | 148/178 |
| 3,990,097 | 11/1976 | Lindmayer | 357/30 |
| 4,012,235 | 3/1977 | Mayer | 148/185 |

FOREIGN PATENT DOCUMENTS 2635817  2/1978  Fed. Rep. of Germany ............. 20/572

*Primary Examiner*—James R. Hoffman
*Attorney, Agent, or Firm*—Martin G. Reiffin; James R. McBride

[57] ABSTRACT

A method of making silicon solar cells and other silicon photovoltaic cells. The method includes the steps of forming a silicon element having a metallic electrode coating on one surface of the element, applying to the other surface of the element a coating containing aluminum and silicon and heating the coated element at a temperature below the eutectic temperature of aluminum-silicon to form an antireflective coating of a fine matrix of silicon pyramids doped with aluminum. The matrix formed on the surface of the silicon has an overlying aluminum coating. A portion of the aluminum coating is removed to expose the matrix for use as a photovoltaic cell.

13 Claims, 10 Drawing Figures

FIG. 1A-2

FIG. 1C-1 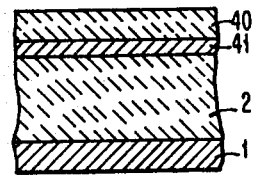 FIG. 1C-2 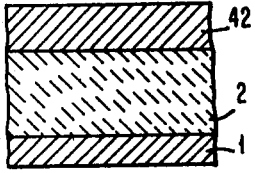

METHOD OF MAKING SILICON PHOTOVOLTAIC CELLS

BACKGROUND OF THE INVENTION

This invention relates to methods of making silicon solar cells and other silicon photovoltaic cells.

For making silicon photovoltaic cells, particularly solar cells, a great number of process steps has heretofore been required and which necessarily involves considerable manufacturing expense. First, a suitable silicon wafer had to be subjected to a diffusion for forming a PN junction; then, an antireflective layer had to be provided either through surface sputtering or vapor deposition of specific layers for subsequently carrying out the electrode metallization, one of said layers being finally designed as a comb-shaped electrode in a conventional manner.

The absorption capacity and consequently the efficiency of solar cells made in this manner can be considerably improved if, as previously described in German Offenlegungsschrift No. 1 621 511, the irradiated surface is coated with a fine matrix of silicon pyramids. This can be produced by etching a silicon monocrystal surface in (100) orientation so that after this etching process silicon pyramids with their (111) edges remain on the surface.

It is disadvantageous that the PN junction has to be made subsequently, and that the raw material, i.e., the silicon monocrystal layer is relatively expensive. Even if non-monocrystalline silicon can be substituted, (since polycrystalline silicon cannot be used at all), there remains the problem that the manufacture of this material is complex and relatively difficult.

Although the use of polycrystalline and amorphous silicon for solar cells is known per se, the application of electrodes and the application of antireflective coating, particularly for generating a planar PN junction, represent considerable difficulties. A summary on solar cells of conventional design is given in the periodical "Umschau", Volume 77 (1977), No. 13, entitled "Elektrische Energie von der Sonne", pp. 421 to 427.

SUMMARY OF THE INVENTION

It is therefore the primary object of the present invention to provide a manufacturing process for solar cells which compared with hitherto existing processes is much less complicated and less difficult to manufacture, and which can provide reliable and highly efficient solar cells or photovoltaic elements.

According to the invention this object is achieved in the following manner: after the application of aluminum and silicon onto the surface of the respective N-doped silicon layer for providing the antireflective coating, a heating process is performed at a temperature below the eutectic temperature of aluminum-silicon. This heating occurs in a neutral atomosphere until Si pyramids are formed which are coated with a thin Al film which is subsequently partially removed to form a comb-shaped electrode.

As distinguished from prior methods, in the present invention a semiconductor without a PN junction is used for the application of the antireflective coating, since in the present invention the PN junction is advantageously formed simultaneously with the formation of the antireflective coating. From the coating deposited on the N-semiconductor and under the influence of the applied heat a fine network of pyramids consisting of aluminum-doped P-conductive silicon is deposited.

This in itself is a considerable advantage in that no specific diffusion process is required for forming the PN junction so that the heretofore required complex and time-consuming diffusion steps, including the covering of the respective wafer back for preventing a second PN junction, or the application of high temperatures greater than 800° C., are no longer necessary. Furthermore, there is no need for a specific process step for providing a counter electrode, as this is already formed advantageously together with the silicon pyramids as an antireflective coating on the semiconductor surface, since after the precipitation of the silicon there remains an aluminum coating which covers the pyramids. By means of relatively uncomplicated processes the comb-shaped counter electrode can be made subsequently of this Al coating.

As according to the process as disclosed by the invention the semiconductor surface is covered with microscopically small pyramids the result is a highly efficient antireflective phenomenon, and a corresponding light absorption. Due to internal multi-reflections of the long-wave light between the back and front of the photoelectric element, the semiconductor surface covered with the pyramid network achieves a corresponding increase of efficiency.

Although for attaining a high efficiency for the solar cell it is of particular advantage to use an Si-layer of a low doping concentration it is on the other hand possible to use a doping of more than $5 \times 10^{18}$ impurity atoms per cm$^3$, the contacting of the N-doped portion being then particularly uncomplicated. When non-monocrystalline silicon is used an N+-layer which then merges into an N−-layer can first be produced. A typical N+-concentration would then be $10^{20}$ impurity atoms/cm$^3$, whereas a typical N−-concentration could show $5 \times 10^{15}$ impurity atoms/cm$^3$.

For carrying out the process steps as disclosed by the invention there are various possibilities, i.e., to coat the Si-layer accordingly by means of cathode sputtering of an aluminum alloy rich in silicon as target, or to apply aluminum and silicon on the Si-layer by means of vacuum vapor deposition. In both process steps, an alloy is advantageously used as starting material for which 1% to 5% of silicon dissolved in aluminum is selected, with the maximum silicon solubility at the heating temperature used being considered. When separate crucibles are used for aluminum and silicon, the respectively different vapor deposition rates for aluminum and silicon have to be applied during simultaneous heating. On the other hand, it is also possible to carry out the invention in that separate layers of aluminum and silicon are applied on the Si-layer. There, the first applied aluminum layer is advantageously about 4000 Å thick, and the subsequently deposited silicon layer should have a thickness of 2000 Å.

When a monocrystalline Si-layer is used heating temperature and heating time, according to an advantageous embodiment of the invention, are selected in such a manner that a P-N junction as deep as possible is obtained, i.e., down to, 0.1 μm measured from the surface. When grain boundary-free monocrystalline Si-layers are used it is furthermore of advantage to use a heating temperature of more than 500° C., during a heating time of 4 to 5 hours.

Due to the advantages of the process as disclosed by the invention it is also easily possible to employ nonmonocrystalline silicon as Si-layer. The same naturally applies also to an Si-layer containing grain boundaries. In an advantageous embodiment of the invention amorphous silicon, to give an example, is applied on a substrate surface consisting particularly of steel so that an amorphous, N-doped Si-layer of some 10 μm thickness is formed on this metal substrate surface. As described above this step is then followed by the application of aluminum and silicon.

For forming the amorphous Si-layer, different processes can be used which are known per se, i.e., cathode sputtering and reaction deposition, as specified in "Frankfurter Zeitung" of Sept. 28, 1977 under the heading "Amorphes Silizium fur die Halbleiterfertigung", where a gaseous silicon compound, i.e., silane is used as a starting material which in an electric discharge is dissociated so that an amorphous silicon film can be formed on a heated substrate.

Generally, annealing for forming the pyramid network is advantageously carried out in a neutral atmosphere, i.e., argon, to exclude reactions.

The comb-shaped counter electrode made of the Al coating remaining after annealing can be made by means of photolithographic or printing processes known per se, or advantageously by means of applying a wax layer on the precipitated Al thin film after annealing. The wax layer can consist of picein and is applied in the form of the respective comb electrode. The metal surface parts remaining after the application of this wax layer are exposed to a solution consisting of $H_3PO_4H$-$NO_3$, $HCl$ and $H_2O$ in the ratio 20:10:10:60 so that the metal therebeneath is etched-off. The remaining wax is then removed by a $CHCl_3$ solution.

The invention thus provides a relatively simple manufacturing process for photoelectric silicon elements which requires much less additional process steps than in formerly used processes. In view of the fact that the heating temperature selected is relatively low there is no diffusion of Al into the Si-layer along the grain boundaries so that amorphous, polycrystalline and also quasi-monocrystalline silicon can easily be used for that purpose.

Below, the invention will be described in detail on the basis of embodiments by means of the drawings given below.

BRIEF DESCRIPTION OF THE DRAWINGS

The drawings show the following:

FIGS. 1A–1G are cross-sectional segments of the respective intermediary product obtained by the various process steps, in the production of the silicon photovoltaic cell in accordance with the invention.

DISCLOSURE OF THE INVENTION

Figures 1, 1A:
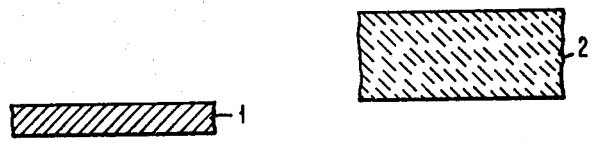
Figure 1B:
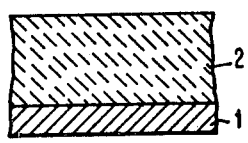
Figure 1D:
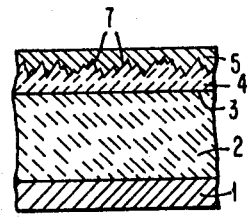
Figure 1E:
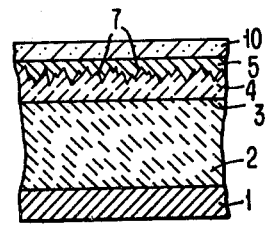
Figure 1F:
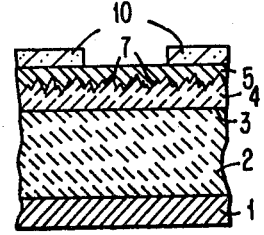
Figure 1G:
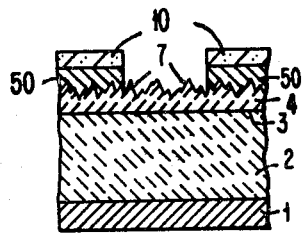

The cross sectional segments of FIG. 1 of the intermediary products obtained through process steps A–G are not ture to scale, so that there is no proportional enlargement of the individual elements. The same elements of the individual cross-sectional segments, however, have the same reference numbers. The process as disclosed by the invention uses an Si-layer 2 which can be represented either by a silicon wafer alone, as shown on the right side by process step A, or as in process step A on the left side by a layer 2 deposited on a substrate 1 suitably serving equally as one of the electrodes, as shown by process step B. The Si-layer 2 is formed by an N-semiconductor which may be doped as usual, i.e., less than $5 \times 10^{18}$ impurity atoms/$cm^3$, with the Si-layer 2, however, prior to metallization being applied with $N^-$-doped Si in accordance with known methods for making ohmic contacts. In "Journal of the Electro-chemical Society", Volume 104, No. 4, April 1957, under the heading "Electroless Nickel Plating for Making Ohmic Contacts to Silicon" on pp. 226 to 230, to give an example, a process is described where nickel is deposited out of an alkaline solution by an electroless process onto an Si-substrate with $5 \times 10^{15}$ phosphorous atoms/$cm^3$ for carrying out a subsequent annealing at 700° C. There, a contact quadratic area resistance of approximately 0.01 $\Omega$ is obtained.

In another publication in the same periodical, Volume 103, Nov. 4, April 1956, entitled "Five Metal Hydrides as Alloying Agents on Silicon" on pages 218 to 220, a method is described for contacting $N^-$-doped silicon through accelerating the alloying process of lead-tin solder by means of zirconium and titanium hydrides. Typical contact resistances of 0.001 $\Omega/cm^2$ can be achieved there.

Equally by using lead-tin solder and fusion by means of laser beams, ohmic contacts can be applied on Si-semiconductors, as described in the periodical "Soviet Physics Semiconductors", Volume 3, No. 11, May 1970, pp. 1383 to 1385.

Finally, the book by Lindmayer-Wrigley, "Fundamental of Semiconductor Devices", mentions on pages 358 and 359 the forming of ohmic contacts by producing high defect densities by means of mechanically roughening the crystal surface, e.g., sandblasting. In all instances there is the same result, i.e., that the forming of a Schottky barrier layer is prevented which on the other hand during operation of the silicon photovoltaic element made in accordance with the invention would considerably affect its efficiency.

The Si-layer 2 itself can consist of a great variety of Si modifications. A quasi-monocrystalline and a poly-crystalline structure as in U.S. Pat. No. 4,019,195 and in German Offenlegungsschrift No. 2 363 135 is a highly suitable starting material for making silicon solar cells which, when they are made in accordance with the invention are considerably less expensive than before.

Semiconductor surfaces as such covered with Si pyramids can be made through epitaxial growth of layers of 150–300 μm density, as described in "Metallurgical Society Conferences", Volume 12, entitled "Metallurgy of Elemental and Compounds Semiconductors", on pp. 246, 247 published by "Interscience Publishers", New York/London 1961. However, such structures cannot be used as solar cells as the forming of a PN junction in a defined depth cannot take place in one and the same process step.

According to the invention, amorphous silicon can also be applied for forming the Si-layer 2. This can be done in a manner known per se by means of vapor deposition or cathode sputtering in a conventional apparatus but only under the condition that in this process there is a respective percentage of N-impurity atoms whose concentration advantageously decreases from $N^+$-concentration to $N^-$-concentration in the direction N to the pyramid-covered surface in order to obtain the required doping of the Si-layer 2. One of the possible processes of application is also given in the above mentioned article "Amorphes Silizium fur die Halbleiterfertigung" in the "Frankfurter Zeitung" of Sept. 28, 1977. It is pointed out, however, that none of the applicable processes for depositing an amorphous Si-layer 2 conventionally doped with N-impurity atoms involves any problems in the producing of the silicon photovoltaic cell since in the process as disclosed by the invention, after the disposition of the Si-layer 2 onto the respective substrate 1, or after a respective processing of the wafer, no PN junction has to be introduced thereafter. At any rate, a metal substrate 1 of the Si-layer 2 can equally be used as a negative electrode of the silicon photovoltaic element to be made.

When an amorphous silicon modification is used, the process can e.g., be applied as follows:

According to FIG. 1A-1, a steel substrate is used as electrode, i.e., for the substrate 1 of the Si-layer 2. This steel substrate 1 is inserted into a known cathode sputtering device in order to subsequently sputter on N-conductive silicon in an amorphous state as layer 2 in a thickness of some 10 µm. The N-conductive deposition thus obtained as Si-layer 2 is excellently suited for applying the anti-reflective coating according to the invention in the form of the network of Si pyramids 7, with the simultaneous forming of the P-zone 4 and the counter-electrode 5.

Figure 2:
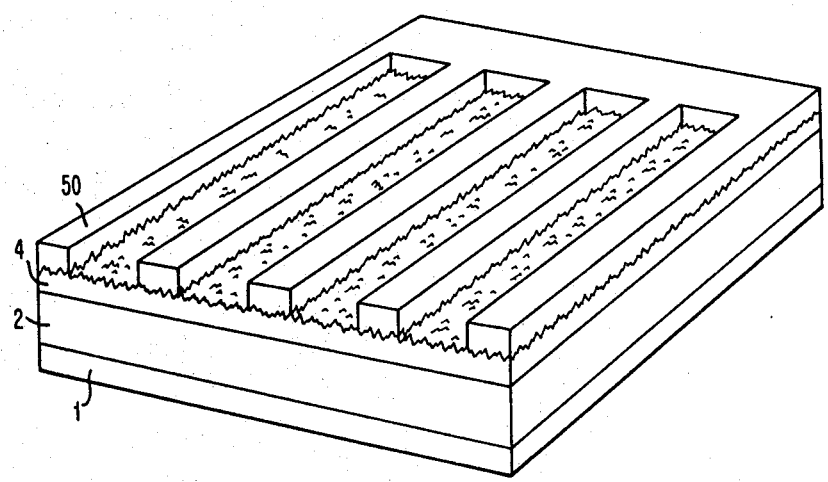
FIG. 2 is a perspective schematic view of the silicon photovoltaic cell in accordance with the invention.

After process step B is terminated there consequently exists a semiconductor 2 with a metal electrode 1. Onto this monocrystalline, quasi-monocrystalline, polycrystalline or amorphous semiconductor as Si-layer 2 the aluminum-silicon coating is subsequently deposited in accordance with process step C. This coating can be deposited on Si-layer 2 either as an alloy layer 42, shown in FIG. 1C-2, or in the form of respectively separated aluminum and silicon films 41, 42, shown in FIG. 1C-1, which Si-layer 2, as pointed out above, represents either a wafer or a layer deposited on a substrate. In all cases, however, it is possible to use either cathode sputtering or vapor deposition processes which are well known in this technical field. In both deposition processes, an aluminum layer with a high silicon content can be advantageously used as raw material. Depending on the height of the heating temperature, as used after the application of the aluminum alloy rich in silicon onto the Si-layer 2, the percentage of the silicon in the aluminum is 1% to 5% since the solubility of silicon in aluminum increases with rising heating temperature.

If the coating is deposited by means of an evaporation process this is suitably performed in a vacuum to prevent from the start the intrusion of impurities into the coating deposition 42. The crucible containing the aluminum alloy rich in silicon is therefore, heated accordingly until the coating 42 on Si-layer 2 has reached a sufficient thickness.

Another way of applying the coating deposition 42 onto Si-layer 2 consists in that separate crucibles are used for aluminum and silicon, different heating rates according to the solubility of silicon in aluminum having to be considered when the heating of the two crucibles takes place simultaneously. Finally, as shown in process step C-1 on the left-hand side, it is also possible to apply separate aluminum and silicon layers 41, 40 onto Si-layer 2, with the two above mentioned processes being also applied. Of course, only one respective crucible is then effective in the deposition of a layer. First, a 4000 Å thick aluminum layer 41 is advantageously applied on Si-layer 2, and then the 2000 Å thick silicon layer 40 is, in turn, applied on aluminum layer 41. It should be pointed out here that aluminum can supply P-impurity atoms in a silicon semiconductor.

According to the invention, the application of the silicon-aluminum coating 42 or 40, 41, respectively is followed by the annealing process which in all cases takes place below the melting point of the eutectic mixture of aluminum/silicon (89:11%). In this annealing process (process step D), Si pyramids 7 in deposit 4 are settled out on Si-layer 2 as a close network so that after the termination of process step D the semiconductor surface is closely covered with Si pyramids 7. In the case of a monocrystalline or quasi-monocrystalline Si-layer 2 P-doped Si pyramids which are epitaxially applied are obtained. It is important to note that although in this process the Si pyramids 7 are doped with P-impurity atoms the Si-layer 2 therebeneath practically cannot receive any Al atoms since the diffusion temperature required herefore, in connection with the equally required diffusion duration, cannot be reached when the process as disclosed by the invention is used. The annealing process as disclosed by process step D takes place in a neutral atmosphere, but preferably in argon in order to avoid undesired reactions.

The heating temperature used for annealing is decisive for the height of the formed Si pyramids 7, and for the depth of PN junction 3. With a relatively high heating temperature, the crystallization is correspondingly higher so that smaller Si pyramids 7 are obtained due to the forming of relatively small crystals and that PN junction 3 is in a greater depth, too. On the other hand, it should also be considered that the annealing time can have a certain influence, too. At a relatively low temperature, the Si pyramids 7 obtained are taller accordingly, with the PN junction, however, being shallow; as pointed out above, it can be placed at a greater depth through applying a longer annealing time. To give an example: At an annealing time of 4 to 5 hours, the heating temperature can be at 500° C., as in the given embodiment with a 4000 Å thick aluminum layer 41 on Si-layer 2, and with an Si-layer 40 applied on this aluminum layer 41 in a thickness of 2000 Å.

In the raw material for the coating of the Si-layer 2, the aluminum percentage should be so high that the aluminum layer 5 thickness obtained after the annealing process in process step D is such that the electric resistance in this aluminum layer 5 is sufficiently low for a use as silicon photovoltaic cell. It has to be taken into consideration here that this aluminum layer 5 has still to be etched for forming a comb-like electrode 50, using process steps E to G. Since, apart from the resistance in P-zone 4 the electrode resistance is of considerable importance for the efficiency of a silicon photovoltaic element, this point has to be considered accordingly.

Summing up this feature it can be stated that the heating temperature for the annealing in process step D is quite decisive for the height of Si pyramids 7 forming on Si-layer 2, and for the depth of PN junction 3. With a temperature that is rising during the annealing process, the crystallization speed rises, too, so that smaller Si pyramids 7 form on the surface of Si-layer 2 due to smaller crystals being formed there. Besides, the depth of PN junction 3 increases with the heating temperature, the duration of the annealing process being also of importance since with a longer heating duration PN junction 3 is provided at a correspondingly greater depth. If the heating temperature during annealing is less high, correspondingly bigger crystals are formed on the Si-layer 2 surface, with the PN junction 3 being shallow accordingly. As pointed out above, however, it is also possible to provide a greater depth PN junction 3 through correspondingly increasing the heating duration.

When a monocrystal is used as Si-layer 2, the PN junction should be as deep as possible, i.e., up to 0.1 μm approximately from the surface.

Therefore, the intermediate product obtained after the termination of process step D contains an N-doped Si-layer 2 which is coated with a layer 4 containing P-doped Si pyramids 7 on its side facing away from electrode 1, in the form of a close network, Si pyramids 7, in turn, being covered with an aluminum metallization 5 which, as stated above, is applied in a thickness required for the purposes involved, and which is used for representing the counter electrode by means of process steps E to G.

Si pyramids 7 on the surface of Si-layer 2 are obtained in a density sufficient for the antireflection capability if silicon is provided in a sufficient quantity for process step C. Although the Si pyramids 7 are microscopically small the antireflection capability of layer 4 is sufficiently high and consequently sufficiently effective, since with a high density of the Si pyramids 7 on the surface of Si-layer 2 impinging light beams are directed upon reflection to other respective Si pyramids 7 and can, therefore, not at all be radiated to the outside. Furthermore, owing to the surface of Si-layer 2 being covered with Si pyramids 7, internal multiple reflections of the light of longer wavelengths between back and front of the silicon photovoltaic cell additionally increase the efficiency.

For the specific design of counter electrode 50 in a comb-like form, known photolighographic or printing processes can be applied, as they are used for making monolithically integrated semiconductor circuits. A method which is of advantage particularly for the silicon photovoltaic cell as disclosed by the invention consists in that in accordance with process step E a wax layer 10, e.g., picein, is applied on aluminum metallization 5 in the form of the respective comb-like electrode 50 (process step F). Subsequently, in a continuation of process step F the free surface of aluminum metallization 5 is exposed to an etching solution made of $H_3PO_4$, $HNO_3$, HCl and $H_2O$ in a ratio 20:10:10:60 so that aluminum metallization 5 can be etched off as desired. Previously covered Si pyramids 7 are exposed when process step G is applied, and the wax which is still on the thus obtained comb-like electrode 50 is subsequently removed by means of a $CHCl_3$ solution. The thus produced comb electrode 50 is the positive pole of the silicon photovoltaic element as made in accordance with the invention, whose negative pole is represented by the already provided metal electrode 1.

As a summing up it can be pointed out that by means of the process as disclosed by the invention the PN junction 3, the metallization of counter electrode 50, and the antireflection layer 4 are made in two process steps only in the production of a silicon photovoltaic cell. This in itself represents a considerable reduction of the manufacturing steps for photovoltaic cells, but if it is furthermore considered that owing to the use of the process as disclosed by the invention not only an expensive, monocrystalline structure, but also other and much less expensive Si modifications can be employed the advantage of the invention is quite evident. This advantage is further increased by the fact that the PN junction 3 required for providing a photovoltaic cell does not have to be diffused subsequently into the Si semiconductor but appears automatically when the Si pyramids 7 are formed. Still another important simplification of the manufacturing process is obtained in that according to the invention the heat process steps of the manufacturing process can be applied in a closed cycle without the work pieces or intermediate products, respectively, being exposed to contaminating influences in the phases between the individual process steps.

While I have illustrated and described the preferred embodiments of my invention, it is to be understood that I do not limit myself to the precise constructions herein disclosed and the right is reserved to all changes and modifications coming within the scope of the invention as defined in the appended claims.

Having thus described my invention, what I claim as new, and desire to secure by Letters Patent of the United States is:

1. A method of making silicon solar cells and other silicon photovoltaic cells and comprising the steps of
   forming a silicon element having a metallic electrode coating on one surface of said element,
   applying to the other surface of said element a coating comprising aluminum and silicon,
   heating said coated element at a temperature below the eutectic temperature of aluminum-silicon to form an antireflective coating of a fine matrix of silicon pyramids doped with aluminum,
   said matrix having an overlying aluminum coating, and removing a portion of said aluminum coating to expose said matrix for use as a photovoltaic cell.

2. A method as recited in claim 1 and comprising the step of doping the silicon element with arsenic.

3. A method as recited in claim 1 and comprising the step of doping the silicon element with phosphorous.

4. A method as recited in claim 2, wherein the doping step is performed up to an impurity atom concentration of at most $10^{19}$ atoms per $cm^3$.

5. A method as recited in claims 1, 2, 3 or 4, characterized in that the coating of aluminum and silicon is applied to the silicon element by means of cathode sputtering at a target consisting of an aluminum alloy with a high silicon content.

6. A method as recited in claims 1, 2, 3 or 4, characterized in that the coating of aluminum and silicon is applied to the silicon element by means of vacuum vapor deposition.

7. A method as recited in claim 6, characterized in that a 4000 Å thick aluminum layer, and then a 2000 Å thick silicon layer are deposited on the silicon element.

8. A method as recited in claim 7, characterized in that said heating is at a temperature of more than 500° C. with a heating time of 4 to 5 hours.

9. A method as recited in claim 8, characterized in that the silicon element is formed of nonmonocrystalline silicon.

10. A method as recited in claim 1, characterized in that a steel substrate is coated with an amorphous N-doped silicon layer of aobut 10 μm thickness and constituting said silicon element, and that subsequently aluminum and silicon are deposited thereon.

11. A method as recited in claim 1 characterized in that said antireflective coating is formed in a double layer laminate comprising a silicon layer and an aluminum layer, and that subsequently this laminate is tempered in an argon atmosphere for about 2 hours at a temperature of about 450° C.

12. A method as recited in claim 1 characterized in that said matrix is exposed by applying a wax layer in the form of a comb-shaped electrode to said aluminum coating, and that exposed aluminum areas are thereafter etched off.

13. A method as recited in claim 12 wherein said wax layer comprises picein.

* * * * *